United States Patent
Chung et al.

(10) Patent No.: US 10,256,165 B2
(45) Date of Patent: Apr. 9, 2019

(54) BENDABLE DISPLAY APPARATUS

(71) Applicant: Samsung Display Co., Ltd., Yongin-si, Gyeonggi-do (KR)

(72) Inventors: Yunmo Chung, Yongin-si (KR); Ilhun Seo, Yongin-si (KR); Hojin Yoon, Yongin-si (KR); Daewoo Lee, Yongin-si (KR); Minseong Yi, Yongin-si (KR); Miyeon Cho, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/608,550

(22) Filed: May 30, 2017

(65) Prior Publication Data
US 2018/0068919 A1   Mar. 8, 2018

(30) Foreign Application Priority Data
Sep. 6, 2016 (KR) .................. 10-2016-0114449

(51) Int. Cl.
| | |
|---|---|
| *G09G 3/36* | (2006.01) |
| *H01L 23/482* | (2006.01) |
| *H01L 27/02* | (2006.01) |
| *H01L 23/31* | (2006.01) |
| *H01L 23/538* | (2006.01) |
| *H01L 51/00* | (2006.01) |

(52) U.S. Cl.
CPC .......... *H01L 23/31* (2013.01); *G09G 3/3685* (2013.01); *H01L 23/4824* (2013.01); *H01L 23/5387* (2013.01); *H01L 27/0248* (2013.01); *H01L 51/00* (2013.01)

(58) Field of Classification Search
CPC ..... H01L 23/31; H01L 51/00; H01L 27/0248; H01L 23/5387; H01L 23/4824; G09G 3/3685
See application file for complete search history.

(56) References Cited

U.S. PATENT DOCUMENTS

| | | | |
|---|---|---|---|
| 9,048,444 B2 | 6/2015 | Kim et al. | |
| 9,786,229 B2* | 10/2017 | Lee | ............ G09G 3/3291 |
| 9,793,334 B2* | 10/2017 | Park | ............ H01L 27/3276 |
| 9,843,020 B2* | 12/2017 | Kim | ............ H01L 51/5253 |
| 2008/0030667 A1* | 2/2008 | Lee | ............ G02F 1/13452 |
| | | | 349/150 |
| 2014/0042406 A1 | 2/2014 | Degner | |

(Continued)

FOREIGN PATENT DOCUMENTS

| | | |
|---|---|---|
| KR | 10-2014-0108827 A | 9/2014 |
| KR | 10-2014-0122960 A | 10/2014 |

(Continued)

*Primary Examiner* — Tracie Y Green
(74) *Attorney, Agent, or Firm* — Innovation Counsel LLP

(57) ABSTRACT

Provided is a display apparatus capable of minimizing defect occurrences during manufacturing of the display apparatus while securing a long lifespan of the display apparatus. The display apparatus includes a substrate comprising a bent area between a first area and a second area and bent about a bending axis, display devices on the first area, a scan driving circuit unit on the second area, a first encapsulation layer configured to cover the display devices, and a second encapsulation layer apart from the first encapsulation layer and configured to cover the scan driving circuit unit.

14 Claims, 10 Drawing Sheets

(56) References Cited

U.S. PATENT DOCUMENTS

| | | | |
|---|---|---|---|
| 2014/0306941 A1 | 10/2014 | Kim et al. | |
| 2014/0333858 A1 | 11/2014 | Martisauskas | |
| 2015/0279263 A1* | 10/2015 | Lim | G09G 3/2092 |
| | | | 345/214 |
| 2016/0378224 A1* | 12/2016 | Kwon | H01L 51/5256 |
| | | | 345/174 |
| 2017/0040347 A1* | 2/2017 | Seo | H01L 51/5246 |
| 2017/0278871 A1* | 9/2017 | Dong | H01L 23/60 |

FOREIGN PATENT DOCUMENTS

| | | |
|---|---|---|
| KR | 10-2015-0010411 A | 1/2015 |
| KR | 10-2016-0018859 A | 2/2016 |

* cited by examiner

BENDABLE DISPLAY APPARATUS

CROSS-REFERENCE TO RELATED APPLICATION

This application claims the benefit of Korean Patent Application No. 10-2016-0114449, filed on Sep. 6, 2016, in the Korean Intellectual Property Office, the disclosure of which is incorporated herein in its entirety by reference.

BACKGROUND

1. Field

One or more embodiments relate to display apparatuses, and more particularly, to a display apparatus capable of minimizing defect occurrences during manufacturing of the display apparatus while securing a long lifespan of the display apparatus.

2. Description of the Related Art

In general, a display apparatus includes a display unit on a substrate. Such a display apparatus may be bent at least partially so as to reduce an area of a non-display region.

However, according to related art, defects may occur while manufacturing a display apparatus that is bent, or the lifespan of the display apparatus may be reduced.

SUMMARY

One or more embodiments include a display apparatus capable of minimizing defect occurrences during manufacturing of the display apparatus while securing a long lifespan of the display apparatus. However, the one or more embodiments are only examples, and the scope of the present invention is not limited thereto.

Additional aspects will be set forth in part in the description which follows and, in part, will be apparent from the description, or may be learned by practice of the presented embodiments.

According to one or more embodiments, a display apparatus includes a substrate including a bent area between a first area and a second area, the substrate bent about a bending axis; display devices over the first area; a scan driving circuit unit over the second area; a first encapsulation layer configured to cover the display devices; and a second encapsulation layer apart from the first encapsulation layer and configured to cover the scan driving circuit unit.

The first encapsulation layer may be within the first area and the second encapsulation layer may be within the second area.

Each of the first encapsulation layer and the second encapsulation layer may have a multi-layer structure, and the first encapsulation layer and the second encapsulation layer may have same layer structures as each other.

The display apparatus may further include a plurality of first data pads and a plurality of second data pads over the second area; and a plurality of data lines electrically connected to the plurality of first data pads and the plurality of second data pads and extending to the first area via the bent area.

The display apparatus may further include a first static electricity prevention circuit between the bent area and the display devices; and a second static electricity prevention circuit between the plurality of first and second data pads and the bent area.

The display apparatus may further include a plurality of scan pads between the plurality of first data pads and the plurality of second data pads and electrically connected to the scan driving circuit unit.

The display apparatus may further include a plurality of main scan lines electrically connected to the scan driving circuit unit and extending to the first area via the bent area.

The display apparatus may further include a plurality of sub scan lines extending across the first area, arranged parallel to each other, and crossing the plurality of main scan lines in a one-to-one correspondence.

The display apparatus may further include a first static electricity prevention circuit between the bent area and the display devices; and a second static electricity prevention circuit between the scan driving circuit unit and the bent area.

The display apparatus may further include a bending protection layer arranged on the substrate to correspond to the bent area, wherein the bending protection layer covers the scan driving circuit unit and the second encapsulation layer is a portion of the bending protection layer.

The display apparatus may further include a touch screen unit arranged over the substrate to correspond to the first area and including an additional insulating layer, wherein the second encapsulation layer includes a same material as a material in the additional insulating layer and has a same layer structure as the additional insulating layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
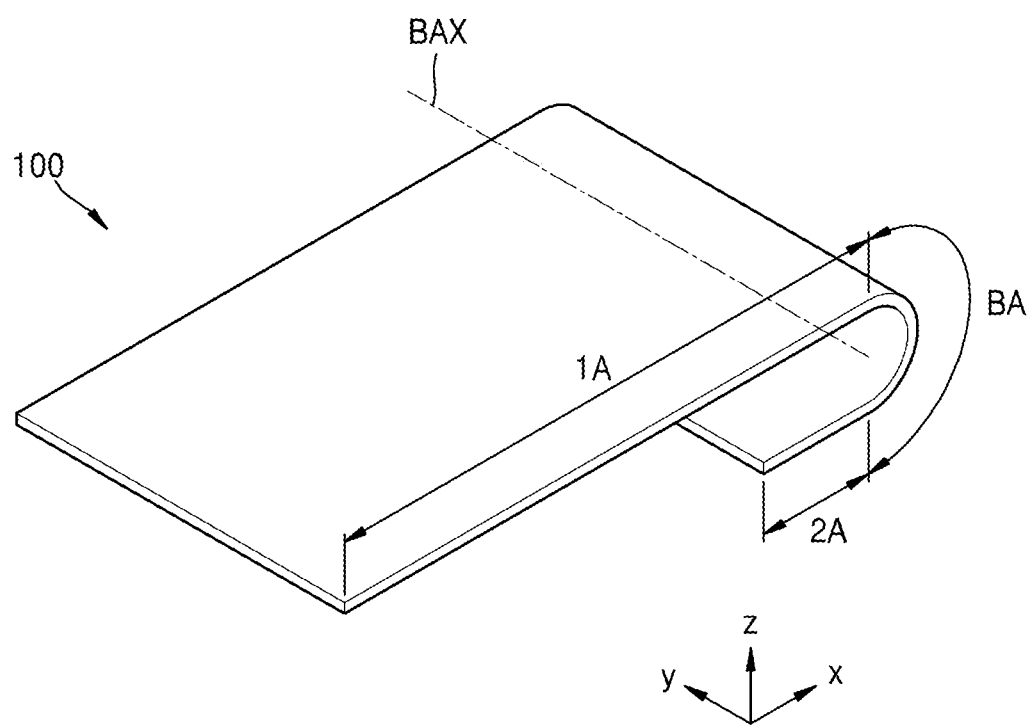
FIG. 1 is a schematic partial plan view of a display device according to an embodiment of the present invention.

As the invention allows for various changes and numerous embodiments, particular embodiments will be illustrated in the drawings and described in detail in the written description. Hereinafter, effects and features of the present invention and a method for accomplishing them will be described more fully with reference to the accompanying drawings, in which embodiments of the invention are shown. This invention may, however, be embodied in many different forms and should not be construed as limited to the embodiments set forth herein.

One or more embodiments of the invention will be described below in more detail with reference to the accompanying drawings. Those components that are the same or are in correspondence are rendered the same reference numeral regardless of the figure number, and redundant explanations are omitted.

It will be understood that, unless otherwise specified, when an element such as a layer, film, region or substrate is referred to as being "over" another element, it can be "directly" on the other element or intervening elements may also be present. In the drawings, the thicknesses of layers and regions are exaggerated or minimized for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
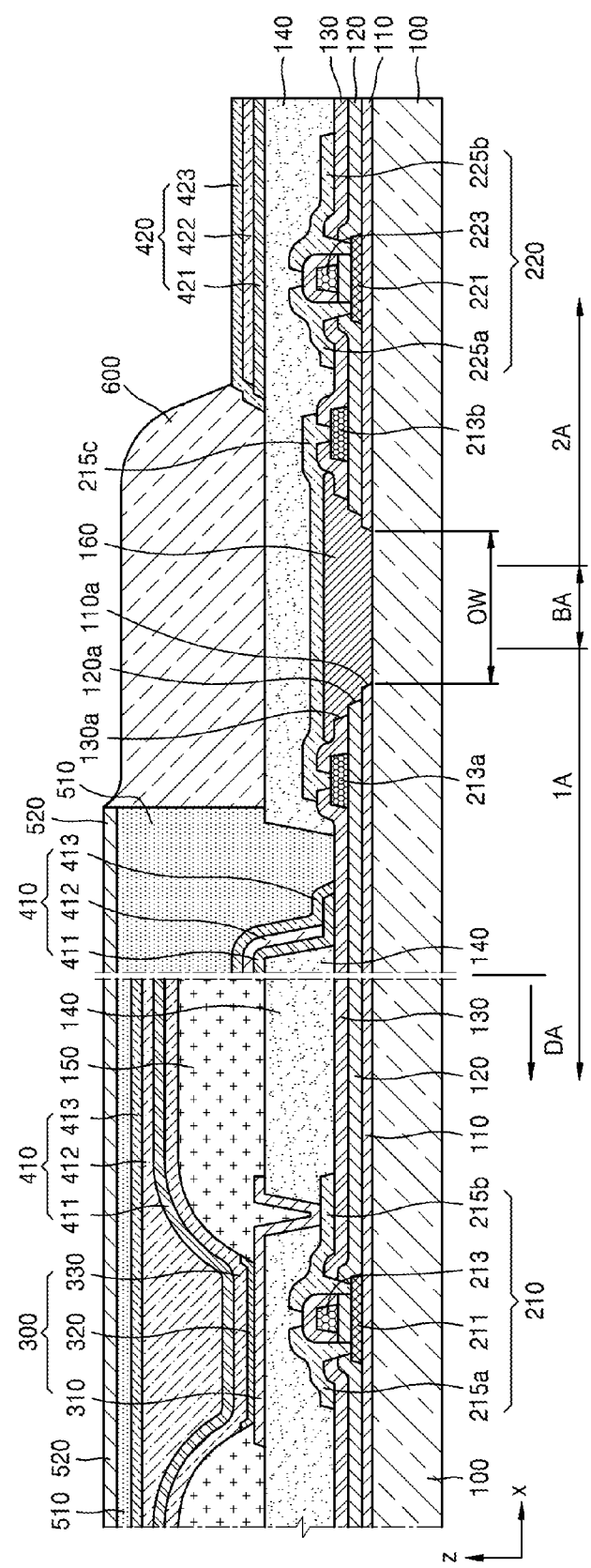
FIG. 2 is a cross-sectional view of a portion of the display apparatus of FIG. 1.

FIG. 1 is a schematic perspective view of a portion of a display apparatus according to an embodiment of the present invention. FIG. 2 is a cross-sectional view of a portion of the display apparatus of FIG. 1.

As shown in FIG. 1, a portion of a substrate 100, which is a portion of the display apparatus according to the present embodiment, is bent, and thus the portion of the display apparatus has a bent shape like the substrate 100. However, for convenience of illustration, FIG. 2 illustrates a not-yet-bent display apparatus. For reference, cross-sectional views, plan views, and/or the like regarding embodiments to be described later illustrate a not-yet-bent display apparatus for convenience of illustration.

Referring to FIGS. 1 and 2, the substrate 100 included in the display apparatus according to the present embodiment has a bent area BA extending in a first direction (+y direction). The bent area BA is between a first area 1A and a second area 2A, in a second direction (+x direction) that crosses with the first direction (+x direction). As shown in FIG. 1, the substrate 100 is bent with respect to a bending axis BAX extending in the first direction (+y direction). The substrate 100 may include various suitable materials having flexible or bendable characteristics. For example, the substrate 100 may include a polymer resin, such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), or cellulose acetate propionate (CAP).

The first area 1A includes a display area DA. As shown in FIG. 2, the first area 1A may further include a portion of a non-display area around the display area DA. The second area 2A includes another portion of the non-display area.

Referring to FIG. 2, the display area DA of the substrate 100 may include a display device 300 and a thin film transistor (TFT) 210 to which the display device 300 is electrically connected. In FIG. 2, an organic light-emitting device (OLED) as the display device 300 is located in the display area DA. The OLED being electrically connected to the TFT 210 may be understood as a pixel electrode 310 being electrically connected to the TFT 210. As shown in FIG. 2, a TFT 220 may be included in the second area 2A of the substrate 100. The TFT 220 in the second area 2A may be a portion of a circuit unit (e.g., a scan driving circuit unit) for controlling an electrical signal applied to the display area DA.

The TFTs 210 and 220 may include semiconductor layers 211 and 221, gate electrodes 213 and 223, source electrodes 215a and 225a, and drain electrodes 215b and 225b, respectively, the semiconductor layers 211 and 221 including amorphous silicon, polycrystalline silicon, or an organic semiconductor material. To secure insulation between the semiconductor layers 211 and 221 and the gate electrodes 213 and 223, a gate insulating layer 120 may be between the semiconductor layers 211 and 221 and the gate electrodes 213 and 223. The gate insulating layer 120 may include an inorganic material, such as silicon oxide, silicon nitride, and/or silicon oxynitride. An interlayer insulating layer 130 may be over the gate electrodes 213 and 223 and may include an inorganic material, such as silicon oxide, silicon nitride, and/or silicon oxynitride. The source electrodes 215a and 225a and the drain electrodes 215b and 225b are over the interlayer insulating layer 130. An insulating layer including such an inorganic material may be formed by chemical vapor deposition (CVD) or atomic layer deposition (ALD). This is equally applied to embodiments to be described later and modifications thereof.

A buffer layer 110 may be between the TFTs 210 and 220 having this structure and the substrate 100 and may include an inorganic material, such as, silicon oxide, silicon nitride, and/or silicon oxynitride. The buffer layer 110 may increase smoothness of an upper surface of the substrate 100 or prevent or minimize infiltration of impurities from the substrate 100 and the like into the semiconductor layer 211 of the TFT 210. Although the buffer layer 110 is a single layer in FIG. 2, various modifications may be made to the buffer layer 110. For example, the buffer layer 110 may be a stack of multiple layers. A barrier layer including an inorganic material, such as silicon oxide, silicon nitride, and/or silicon oxynitride, may further exist over the substrate, in addition to the buffer layer 110.

A planarization layer 140 may be disposed over the TFT 210. For example, when an OLED is disposed over the TFT 210 as illustrated in FIG. 2, the planarization layer 140 may planarize an upper portion of a protection layer that covers the TFT 210. The planarization layer 140 may be formed of an organic material, such as, benzocyclobutene (BCB) or hexamethyldisiloxane (HMDSO). Although the planarization layer 140 is a single layer in FIG. 2, various modifications may be made to the planarization layer 140. For example, the planarization layer 140 may be a stack of multiple layers. As illustrated in FIG. 2, the planarization layer 140 may have an opening outside the display area DA and thus may physically separate a portion of the planarization layer 140 in the display area DA from a portion of the planarization layer 140 in the second area 2A, in order to prevent external impurities from reaching the inside of the display area DA via the planarization layer 140.

An OLED may be disposed over the planarization layer 140, within the display area DA of the substrate 100. The OLED includes the pixel electrode 310, an opposite electrode 330, and an intermediate layer 320 between the pixel electrode 310 and the opposite electrode 330 and including an emission layer. The pixel electrode 310 contacts one of the source electrode 215a and the drain electrode 215b via the opening formed in the planarization layer 140, as shown in FIG. 2, and is electrically connected to the TFT 210.

A pixel definition layer 150 may be disposed over the planarization layer 140. The pixel defining layer 150 defines pixels by including respective openings corresponding to sub-pixels, namely, an opening via which at least a center portion of the pixel electrode 310 is exposed. In such a case as illustrated in FIG. 2, the pixel definition layer 150 prevents an arc from occurring on the edge of the pixel electrode 310 by increasing a distance between the edge of the pixel electrode 310 and the opposite electrode 330 disposed over the pixel electrode 310. The pixel definition layer 150 may be formed of an organic material, for example, polyimide or HMDSO.

The intermediate layer 320 of the OLED may include a low-molecular weight or high-molecular weight material. When the intermediate layer 320 includes a low-molecular weight material, the intermediate layer 320 may have a structure in which a hole injection layer (HIL), a hole transport layer (HTL), an emission layer (EML), an electron transport layer (ETL), and an electron injection layer (EIL) are stacked in a single or complex structure, and may include various organic materials including copper phthalocyanine (CuPc), N,N'-Di(naphthalene-1-yl)-N,N'-diphenyl-benzidine (NPB), and tris-8-hydroxyquinoline aluminum (Alq3). These layers may be formed by vacuum deposition.

When the intermediate layer 320 includes a high-molecular weight material, the intermediate layer 320 may generally include an HTL and an EML. In this case, the HTL may include poly(ethylenedioxythiophene) (PEDOT), and the EML may include a high-molecular material such as a polyphenylenevinylene (PPV)-based material or a polyfluorene-based material. The intermediate layer 320 may be formed by screen printing, inkjet printing, laser induced thermal imaging (LITI), or the like.

The intermediate layer 320 is not limited to the structure described above, and may have any of various other structures. The intermediate layer 320 may include a single layer that covers a plurality of pixel electrodes 310 or may include patterned layers respectively corresponding to the plurality of pixel electrodes 310.

The opposite electrode 330 is disposed over the display area DA. As illustrated in FIG. 2, the opposite electrode 330 may cover the display area DA. In other words, the opposite electrode 330 may be formed as a single body to constitute a plurality of OLEDs, and thus may correspond to the plurality of pixel electrodes 310.

Because these OLEDs may be easily damaged by external moisture, oxygen, or the like, a first encapsulation layer 410 may cover and protect these OLEDs. The first encapsulation layer 410 may cover the display area DA and extend beyond the display area DA. As illustrated in FIG. 2, the first encapsulation layer 410 may include a first inorganic encapsulation layer 411, an organic encapsulation layer 412, and a second inorganic encapsulation layer 413.

The first inorganic encapsulation layer 411 may cover the opposite electrode 330 and may include silicon oxide, silicon nitride, and/or silicon oxynitride. As necessary, other layers, such as a capping layer, may be between the first inorganic encapsulation layer 411 and the opposite electrode 330. Because the first inorganic encapsulation layer 411 is formed along structures below the first inorganic encapsulation layer 411, the upper surface thereof is not flat. The organic encapsulation layer 412 covers the first inorganic encapsulation layer 411. In contrast with the first inorganic encapsulation layer 411, the organic encapsulation layer 412 may have an approximately flat upper surface. In detail, a portion of the organic encapsulation layer 412 corresponding to the display area DA may have an approximately flat upper surface. The organic encapsulation layer 412 may include at least one material from among polyethylene terephthalate, polyethylene naphthalate, polycarbonate, polyimide, polyethylene sulfonate, polyoxymethylene, polyarylate, and hexamethyldisiloxane. The second inorganic encapsulation layer 413 may cover the organic encapsulation layer 412 and may include silicon oxide, silicon nitride, and/or silicon oxynitride. An edge of the second inorganic encapsulation layer 413 outside the display area DA may contact the first inorganic encapsulation layer 411 so that the organic encapsulation layer 412 may not be exposed to the outside.

As such, since the first encapsulation layer 410 includes the first inorganic encapsulation layer 411, the organic encapsulation layer 412, and the second inorganic encapsulation layer 413, even if the first encapsulation layer 410 cracks due to this multi-layer structure, this crack may not be connected between the first inorganic encapsulation layer 411 and the organic encapsulation layer 412 or between the organic encapsulation layer 412 and the second inorganic encapsulation layer 413. Accordingly, formation of a path via which external moisture, oxygen, or the like permeates into the display area DA may be prevented or minimized.

A second encapsulation layer 420 may be disposed over the TFT 220 located within the second area 2A, in order to protect the TFT 220, namely, a scan driving circuit unit. The second encapsulation layer 420 is apart from the first encapsulation layer 410. In detail, the first encapsulation layer 410 may be located within the first area 1A and the second encapsulation layer 420 may be located within the second area 2A. If the first encapsulation layer 410 and the second encapsulation layer 420 were not apart from each other but are connected to each other via the bent area BA, while the substrate 100 is being bent at the bent area BA during manufacturing processes, the first and second encapsulation layers 410 and 420 may crack within the bent area BA and thus a defect may occur.

The structure of the second encapsulation layer 420 apart from the first encapsulation layer 410 may be substantially the same as that of the first encapsulation layer 410. In other words, the first encapsulation layer 410 and the second encapsulation layer 420 may have multi-layer structures, and the multi-layer structures of the first encapsulation layer 410 and the second encapsulation layer 420 may be the same as each other. Similar to the first encapsulation layer 410, FIG. 2 illustrates the second encapsulation layer 420 including a first inorganic encapsulation layer 421, an organic encapsulation layer 422, and a second inorganic encapsulation layer 423. In this case, in the manufacture of the display apparatus, the first encapsulation layer 410 and the second encapsulation layer 420 may be simultaneously formed of the same material, and thus the manufacturing process may be simplified.

A polarization plate 520 may be attached onto the first encapsulation layer 410 by an optically clear adhesive (OCA) 510. The polarization plate 520 may reduce external light reflection. For example, when external light passes through the polarization plate 520, is reflected by the upper surface of the opposite electrode 330, and passes through the polarization plate 520 again, twice passing through the polarization plate 520 may change the phase of the external light. Accordingly, the phase of reflected light is different from that of the external light entering the polarization plate 520, and thus destructive interference occurs. Consequently, visibility may improve by reducing external light reflection. As illustrated in FIG. 2, the OCA 510 and the polarization plate 520 may cover the opening of the planarization layer 140. The display apparatus according to the present embodiment does not always include the polarization plate 520. As necessary, the polarization plate 520 may be omitted, or may be replaced with other structures. For example, the polarization plate 520 may be omitted, and external light reflection may be reduced using a black matrix and a color filter.

The buffer layer 110, the gate insulating layer 120, and the interlayer insulating layer 130 including inorganic materials may be collectively referred to as an inorganic insulating layer. As illustrated in FIG. 2, the inorganic insulating layer has an opening corresponding to the bent area BA. In other words, the buffer layer 110, the gate insulating layer 120, and the interlayer insulating layer 130 may respectively have openings 110a, 120a, 130a corresponding to the bent area BA to collectively make up an opening corresponding to the bent area BA. Such an opening corresponding to the bent area BA may be understood as the opening overlapped with the bent area BA. The area of the opening may be greater than that of the bent area BA. To this end, FIG. 2 illustrates that a width OW of the opening is greater than a width of the bent area BA. The area of the opening may be defined as the area of a narrowest opening from among the openings 110a, 120a, and 130a of the buffer layer 110, the gate insulating layer 120, and the interlayer insulating layer 130. In FIG. 2, the area of the opening is the area of the opening 110a of the buffer layer 110.

Although respective inner surfaces of the opening 110a, the opening 120a, and the opening 130a are discontinuous in FIG. 2, embodiments are not limited thereto. For example, since contact holes are formed through the gate insulating layer 120 and the interlayer insulating layer 130 so that the source electrode 215a and the drain electrode 215b of the TFT 210 are connected to the semiconductor layer 211, the opening 120a and the opening 130a may be simultaneously formed when the contact holes are formed. In this case, the inner surfaces of the opening 120a and the opening 130a may be approximately continuous.

The display apparatus according to the present embodiment includes an organic material layer 160 that fills at least a portion of the opening of the inorganic insulating layer. FIG. 2 illustrates an example where the organic material layer 160 completely fills the opening. The display apparatus according to the present embodiment includes a first conductive layer 215c. The first conductive layer 215 extends from the first area 1A to the second area 2A via the bent area BA and is located over the organic material layer 160. If the organic material layer 160 is omitted, the first conductive layer 215c may be located over an inorganic insulating layer, such as the interlayer insulating layer 130. The first conductive layer 215c may be formed simultaneously with the source and drain electrodes 215a and 215b, and may be formed of the same material as that used to form the source and drain electrodes 215a and 215b.

Although the display apparatus according to the present embodiment is not bent in FIG. 2 for convenience of illustration, the substrate 100 and the like of the display apparatus are actually bent at the bent area BA, as illustrated in FIG. 1. To this end, the display apparatus is manufactured to have an approximately flat substrate 100, as illustrated in FIG. 2, and then the substrate 100 and the like are bent at the bent area BA such that the display apparatus has a shape as shown in FIG. 1. In this case, while the substrate 100 and the like are being bent at the bent area BA, stress may be applied to the first conductive layer 215c. However, the display apparatus according to the present embodiment may prevent or minimize occurrence of defects in the first conductive layer 215c during such a bending process.

If the inorganic insulating layer, such as the buffer layer 110, the gate insulating layer 120, and/or the interlayer insulating layer 130, were to have no openings at the bent area BA and were continuous from the first area 1A to the second area 2A, with the first conductive layer 215c located over this inorganic insulating layer, large stress would be applied to the first conductive layer 215c while the substrate 100 and the like were being bent. In particular, since the hardness of the inorganic insulating layer is higher than the hardness of an organic material layer, the probability that a crack or the like may appear in the inorganic insulating layer at the bent area BA would be greatly high, and if the inorganic insulating layer cracks, the first conductive layer 215c over the inorganic insulating layer would also crack, and thus the probability that a defect, such as, a disconnection, of the first conductive layer 215c occurs would be greatly high.

However, in the display apparatus according to the present embodiment, as described above, the inorganic insulating layer has an opening at the bent area BA, and a portion of the first conductive layer 215c within the bent area BA is located over the organic material layer 160 that fills at least a portion of the opening of the inorganic insulating layer. Since the inorganic insulating layer has an opening at the bent area BA, the probability that a crack or the like appears in the inorganic insulating layer is extremely low. Since the organic material layer 160 includes an organic material, the probability of generating a crack is low. Accordingly, appearance of a crack or the like in the portion of the first conductive layer 215c over the organic material layer 160 within the bent area BA may be prevented, or the probability of appearance of a crack or the like may be minimized. Because the organic material layer 160 has lower hardness than the inorganic material layer, the organic material layer 160 absorbs stress generated due to bending of the substrate 100 or the like and thus may effectively minimize concentration of stress on the first conductive layer 215c.

Although the inorganic insulating layer has an opening in FIG. 2, embodiments are not limited thereto. For example, the inorganic insulating layer may have a groove instead of an opening. In this example, in contrast with FIG. 2, the buffer layer 110 does not have the opening 110a, and may extend from the first area 1A to the second area 2A via the bent area BA and only the gate insulating layer 120 and the interlayer insulating layer 130 may have the openings 120a and 130a, respectively. In this case, the buffer layer 110, the gate insulating layer 120, and the interlayer insulating layer 130 including inorganic materials may be collectively referred to as an inorganic insulating layer. In this case, the inorganic insulating layer may be understood as having a groove corresponding to the bent area BA. The organic material layer 160 may fill at least a portion of the groove. The buffer layer 110 may have a groove instead of the opening 110a.

In this case, as the inorganic insulating layer has a groove within the bent area BA, a thickness of the inorganic insulating layer within the bent area BA decreases, and thus the substrate 100 or the like may be smoothly bent. In addition, since the organic material layer 160 exists within the bent area BA and the first conductive layer 215c is located over the organic material layer 160, the first conductive layer 215c may be effectively prevented from being damaged due to bending. Although the previous embodiments, embodiments to be described later, and modifications thereof illustrate the case where the inorganic insulating layer has an opening, the inorganic insulating layer may have a first groove as described above.

The display apparatus according to the present embodiment may include second conductive layers 213a and 213b in addition to the first conductive layer 215c. The second conductive layers 213a and 213b are arranged in the first area 1A or the second area 2A on a different layer than the layer on which the first conductive layer 215c is located, and may be electrically connected to the first conductive layer 215c. FIG. 2 illustrates that the second conductive layers 213a and 213b are formed of the same material as the material used to form the gate electrode 213 of the TFT 210 and located on the same layer as the layer on which the gate electrode 213 is located, namely, on the gate insulating layer 120. FIG. 2 also illustrates that the first conductive layer 215c contacts the second conductive layers 213a and 213b via a contact hole formed in the interlayer insulating layer 130. FIG. 2 also illustrates that the second conductive layer 213a is located within the first area 1A and the second conductive layer 213b is located within the second area 2A.

The second conductive layer 213a located within the first area 1A may be electrically connected to the TFT 210 and the like within the display area DA. Accordingly, the first conductive layer 215c may be electrically connected to the TFT 210 and the like within the display area DA via the second conductive layer 213a. The second conductive layer 213b located within the second area 2A may be electrically connected to the TFT 210 and the like within the display area DA by the first conductive layer 215c. As such, the second conductive layers 213a and 213b outside the display area DA may be electrically connected to the components located within the display area DA. The second conductive layers 213a and 213b outside the display area DA may extend toward the display area DA, and thus at least portions of the second conductive layers 213a and 213b may be located within the display area DA.

Although the display apparatus according to the present embodiment is not bent in FIG. 2 for convenience of illustration, the substrate 100 and the like of the display apparatus are actually bent at the bent area BA, as illustrated in FIG. 1. To this end, the display apparatus is manufactured to have an approximately flat substrate 100, as illustrated in FIG. 2, and then the substrate 100 and the like are bent at the bent area BA such that the display apparatus has a shape as shown in FIG. 1. While the substrate 100 and the like are being bent at the bent area BA, stress may be applied to the components located within the bent area BA.

Accordingly, since the first conductive layer 215c extending across the bent area BA includes a material having a high elongation percentage, a defect, such as, a crack in the first conductive layer 215c or a disconnection of the first conductive layer 215c, may be prevented. In addition, since the second conductive layers 213a and 213b are formed of a material having a lower elongation percentage than the first conductive layer 215c but having different electrical/physical characteristics than the first conductive layer 215c, within the first area 1A or the second area 2A, the display apparatus may increase efficiency with respect to transmission of an electrical signal or decrease the probability of generation of defects during the manufacture of the display apparatus. For example, the second conductive layers 213a and 213b may include molybdenum, and the first conductive layer 215c may include aluminum. The first conductive layer 215c or the second conductive layers 213a and 213b may each have a multi-layer structure as necessary.

Although the first conductive layer 215c or the second conductive layer 213b are completely covered with the planarization layer 140 and the like within the second area 2A in FIG. 2, embodiments are not limited thereto. For example, the first conductive layer 215c or the second conductive layer 213b may be exposed to the outside within the second area 2A, and the first conductive layer 215c or the second conductive layer 213b may be electrically connected to an integrated circuit, a printed circuit board (PCB), or the like.

As shown in FIG. 2, the organic material layer 160 may cover the inner surface of the opening of the inorganic insulating layer. As described above, the first conductive layer 215c may be simultaneously formed with the source electrode 215a and the drain electrode 215b, of the same material as the material used to form the source electrode 215a and the drain electrode 215b. To this end, a conductive layer is formed over the entire surface of the substrate 100 and then patterned to thereby form the source electrode 215a, the drain electrode 215b, and the first conductive layer 215c. If the organic material layer 160 did not cover the inner surface of the opening 110a of the buffer layer 110, the inner surface of the opening 120a of the gate insulating layer 120, or the inner surface of the opening 130a of the interlayer insulating layer 130, a conductive material of the conductive layer may remain on the inner surface of the opening 110a of the buffer layer 110, the inner surface of the opening 120a of the gate insulating layer 120, or the inner surface of the opening 130a of the interlayer insulating layer 130 without being removed therefrom while the conductive layer is being patterned. In this case, the remaining conductive material may cause a short-circuit between the other conductive layers.

Accordingly, when the organic material layer 160 is formed, the organic material layer 160 needs to cover the inner surface of the opening of the inorganic insulating layer. For reference, although the organic material layer 160 has a uniform thickness in FIG. 2, the organic material layer 160 may have different thicknesses according to locations thereof such that the inclination of a curve of the upper surface of the organic material layer 160 may be gentle around the inner surface of the opening 110a of the buffer layer 110, the inner surface of the opening 120a of the gate insulating layer 120, or the inner surface of the opening 130a of the interlayer insulating layer 130. Accordingly, conductive material that is supposed to be removed while the conductive layer is being patterned to form the source electrode 215a, the drain electrode 215b, and the first conductive layer 215c may be effectively prevented from remaining.

A bending protection layer 600 may be located outside the display area DA. In other words, the bending protection layer 600 may be located over the first conductive layer 215c while facing at least the bent area BA.

When a certain stack is bent, a stress neutral plane exists within the stack. If the bending protection layer 600 were not present, excessive tensile stress or the like may be applied to the first conductive layer 215c within the bent area BA as the substrate 100 and the like are bent, because the first conductive layer 215c may not be located on a stress neutral plane. However, since the bending protection layer 600 exists and its thickness, modulus, and the like are adjusted, a location of a stress neutral plane within a stack including the substrate 100, the first conductive layer 215c, and the bending protection layer 600 may be controlled. Accordingly, by locating the stress neutral plane around or over the first conductive layer 215c via the bending protection layer 600, stress that is applied to the first conductive layer 215c may be minimized, or compressive stress may be applied to the first conductive layer 215c. The bending protection layer 600 may be formed of, for example, acryl. For reference, when compressive stress may be applied to the first conductive layer 215c, the probability that the first conductive layer 215c is damaged by the compressive stress is extremely low, compared with when tensile stress is applied to the first conductive layer 215c.

Although an upper surface of the bending protection layer 600 in a direction of the display area DA (-x direction) coincides with an upper surface of the polarization plate 520 in a +z direction in FIG. 2, embodiments are not limited thereto. For example, an end portion of the bending protection layer 600 in the direction of the display area DA (-x direction) may cover a portion of an edge of an upper surface of the polarization plate 520. Alternatively, the end of the bending protection layer 600 in the direction of the display area DA (-x direction) may not contact the polarization plate 520 and/or the OCA 510. In particular, in the latter case, while the bending protection layer 600 is being formed or after the bending protection layer 600 is formed, gas generated in the bending protection layer 600 may be prevented from moving in the direction of the display area DA (-x direction) and degrading the display device 300 and the like, such as an OLED.

If the upper surface of the bending protection layer 600 in the direction of the display area DA (-x direction) coincides with the upper surface of the polarization plate 520 in the +z direction, the end of the bending protection layer 600 in the direction of the display area DA (-x direction) covers a portion of the edge of the upper surface of the polarization plate 520, or the end of the bending protection layer 600 in the direction of the display area DA (-x direction) contacts the OCA 510, a portion of the bending protection layer 600 in the direction of the display area DA (-x direction) may be thicker than the other portions of the bending protection layer 600. When the bending protection layer 600 is being formed, a liquid- or paste-type material for forming the bending protection layer 600 may be coated and hardened. In this hardening process, the bending protection layer 600 may have a reduced volume. When the portion of the bending protection layer 600 in the direction of the display area DA (-x direction) contacts the polarization plate 520 and/or the OCA 510, the portion of the bending protection layer 600 has a fixed position, and thus the other portions of the bending protection layer 600 may have reduced volumes. Consequently, the portion of the bending protection layer 600 in the direction of the display area DA (-x direction) may be thicker than the other portions of the bending protection layer 600.

The bending protection layer 600 is formed after the first and second encapsulation layers 410 and 420 are formed. Accordingly, as shown in FIG. 2, at least a portion of an end portion of the second encapsulation layer 420 in the direction to the first area 1A may be covered with the bending protection layer 600.

Figure 3:
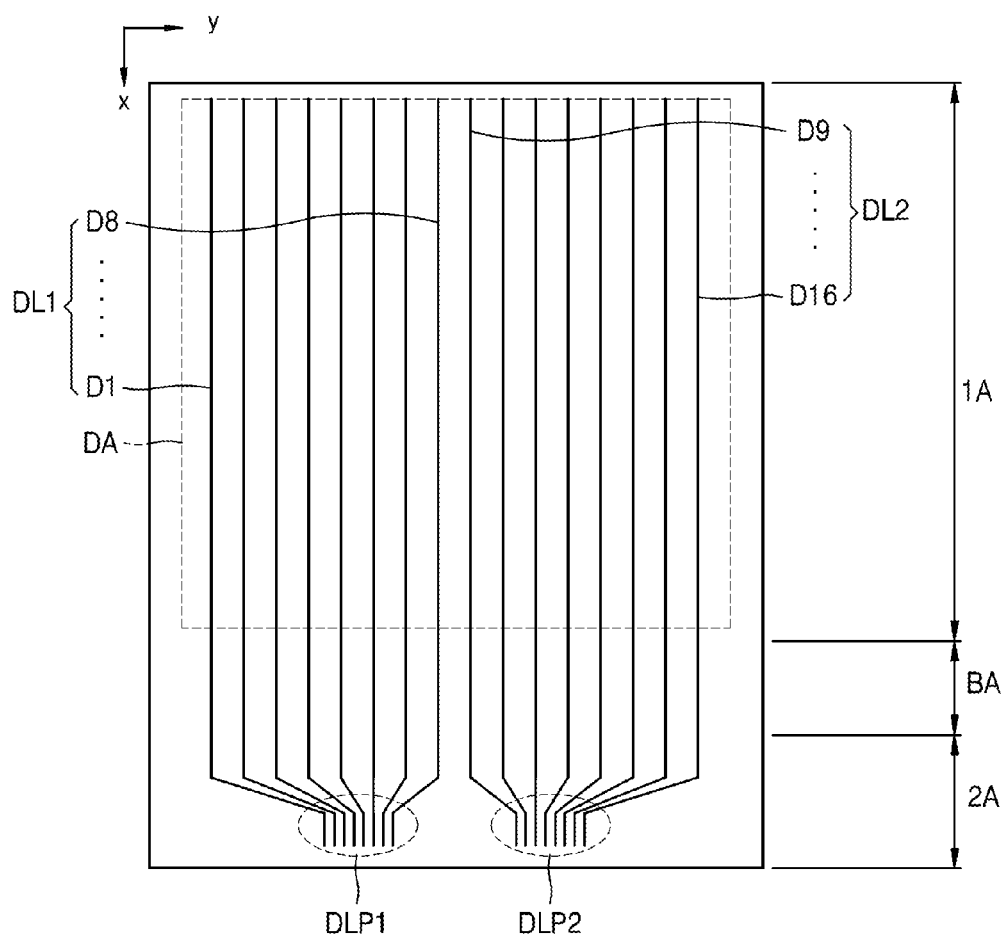
FIG. 3 is a conceptual view of a portion of the display apparatus of FIG. 1.
Figure 4:
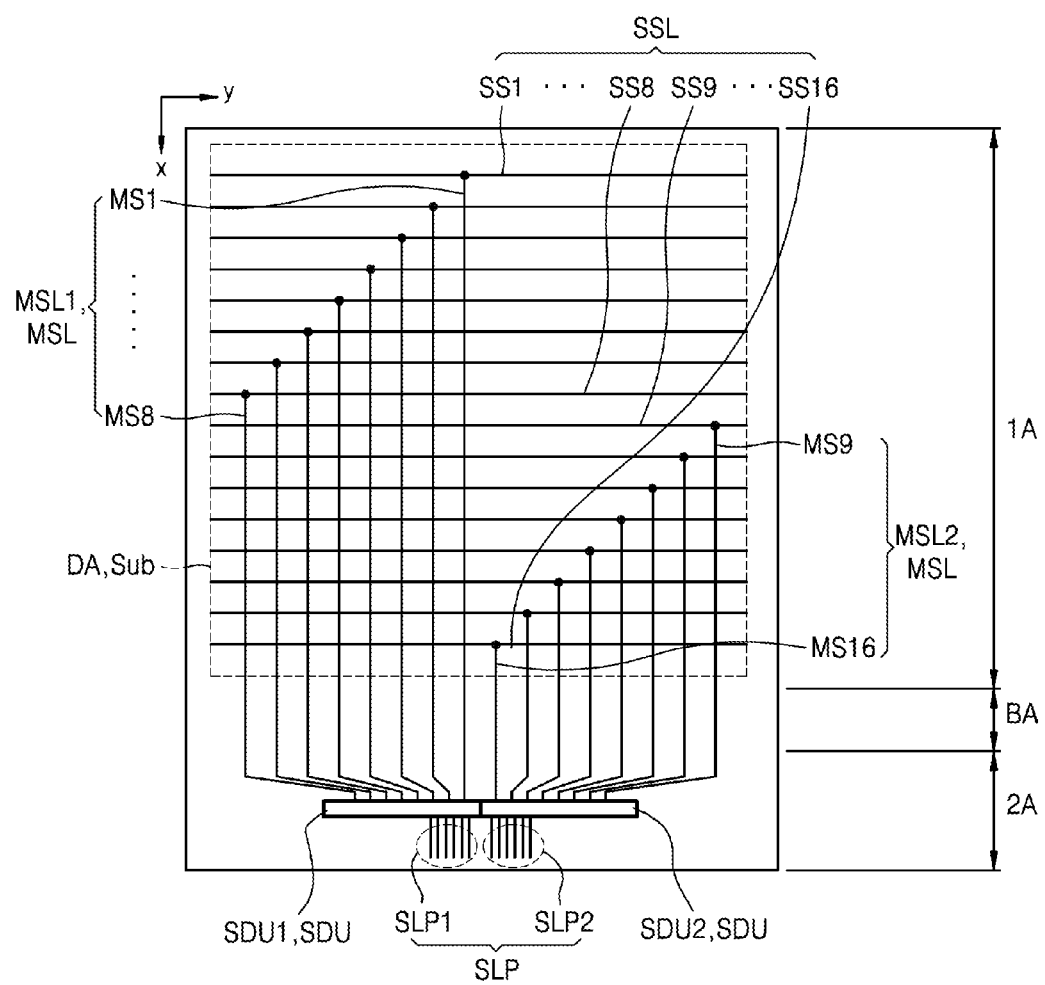
FIG. 4 is a conceptual view of a portion of the display apparatus of FIG. 1.

FIG. 3 is a conceptual view of a portion of the display apparatus of FIG. 1. FIG. 4 is a conceptual view of a portion of the display apparatus of FIG. 1. Referring to FIGS. 3 and 4, the display apparatus according to the present embodiment includes a plurality of first data lines DL1, a plurality of second data lines DL2, a plurality of main scan lines MSL, a plurality of sub-scan lines SSL, a plurality of first data pads DLP1, a plurality of second data pads DLP2, and a plurality of scan line pads SLP arranged over the substrate 100.

Each of the plurality of first data lines DL1 may extend in an x-axis direction across a first display area 1A via the bent area BA, and the plurality of first data lines DL1 may be arranged parallel to one another. FIG. 3 illustrates that eight first data lines D1 through D8 cross the first display area 1A. Each of the plurality of second data lines DL2 may also extend in the x-axis direction across the first display area 1A via the bent area BA, and the plurality of second data lines DL2 may be arranged parallel to one another. FIG. 3 illustrates that, similar to the plurality of first data lines DL1, eight second data lines D9 through D16 cross the first display area 1A. The second data lines D9 through D16 are arranged parallel to the first data lines D1 through D8.

The plurality of main scan lines MSL are arranged as shown in FIG. 4. In detail, the plurality of main scan lines MSL each extend across the display area DA via the bent area BA and are arranged parallel to one another, and the plurality of main scan lines MSL are parallel to the plurality of first data lines DL1 and the plurality of second data lines DL2. FIG. 4 illustrates that a total of sixteen main scan lines MS1 through MS16 each extend in the x-axis direction. The main scan lines MS1 through MS16 may have different lengths, or some of the main scan lines MS1 through MS16 may have the same lengths. For reference, extending of each of the plurality of main scan lines MSL across the display area DA means extending across at least a portion of the display area DA. Each of the plurality of main scan lines MSL does not need to cross the entire display area DA.

The plurality of main scan lines MSL may be understood as including a plurality of first main scan lines MSL1 and a plurality of second main scan lines MSL2. In this case, similar to the plurality of first data lines DL1, the plurality of first main scan lines MSL1 may be understood as each extending across the first display area and being arranged parallel to one another. Similar to the plurality of second data lines DL2, the plurality of second main scan lines MSL2 may be understood as each extending across the second display area and being arranged parallel to one another. FIG. 4 illustrates that eight main scan lines MS1 through MS8 over the left side belong to the plurality of first main scan lines MSL1, and eight main scan lines MS9 through MS16 over the right side belong to the plurality of second main scan lines MSL2.

The plurality of main scan lines MSL directly contact neither the plurality of first data lines DL1 nor the plurality of second data lines DL2. To this end, if the main scan lines MSL are on the same plane as the plurality of first data lines DL1 and the plurality of second data lines DL2, the main scan lines MSL may alternate with the plurality of first and second data lines DL1 and DL2 such that the main scan lines MSL do not directly contact the plurality of first and second data lines DL1 and DL2. Alternatively, if necessary, the plurality of main scan lines MSL may be disposed on a different layer than the layer on which the plurality of first data lines DL1 and the plurality of second data lines DL2 are disposed.

The plurality of sub-scan lines SSL each extend across the display area DA and are arranged parallel to one another. In this case, the plurality of sub-scan lines SSL intersect (cross) with the plurality of main scan lines MSL. FIG. 4 illustrates that the plurality of sub-scan lines SSL each extend in a y-axis direction and intersect (cross) with the plurality of main scan lines MSL each extending in the x-axis direction. The plurality of sub-scan lines SSL may correspond to the plurality of main scan lines MSL in a one-to-one correspondence. FIG. 4 illustrates that 16 sub-scan lines SS1 through SS16 correspond to 16 main scan lines MS1 through MS16, respectively.

The plurality of sub-scan lines SSL may be located on a different layer than the layer on which the plurality of main scan lines MSL are located. In other words, an insulating layer may be between the plurality of sub-scan lines SSL and the plurality of main scan lines MSL. Via a contact hole formed in the insulating layer, the plurality of sub-scan lines SSL may be electrically connected to the plurality of main scan lines MSL. In FIG. 4, black dots indicate the plurality of sub-scan lines SSL being electrically connected to the plurality of main scan lines MSL via the contact hole. In other words, the main scan line MS1 is electrically connected to the sub-scan line SS1, the main scan line MS2 is electrically connected to the sub-scan line SS2, and similarly, the main scan line MS16 is electrically connected to the sub-scan line SS16.

Figure 5:
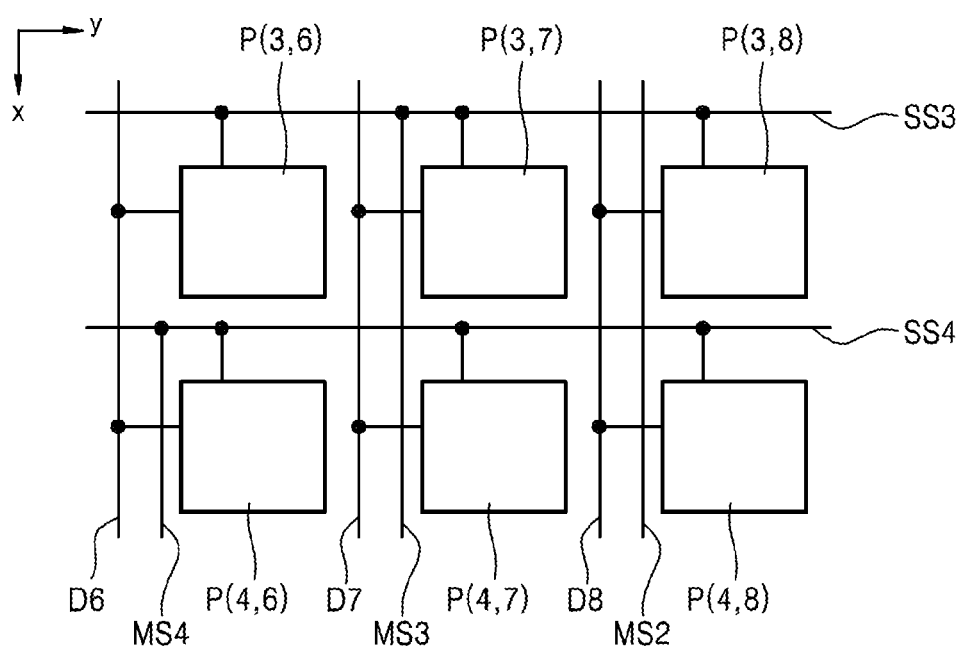
FIG. 5 is a conceptual view of a portion of the display apparatus of FIG. 1.

Intersections between the plurality of first and second data lines DL1 and DL2 and the sub-scan lines SSL may be understood as where (sub)-pixels are defined, respectively. Hereinafter, sub-pixels and pixels are collectively referred to as pixels. FIG. 5 is a schematic conceptual view of a portion of the display apparatus of FIG. 1, and thus schematically illustrates areas of pixels. Referring to FIG. 5, a pixel P(3,6) is located at an intersection between the sub-scan line SS3 and the data line D6, a pixel P(3,7) is located at an intersection between the sub-scan line SS3 and the data line D7, and a pixel P(3,8) is located at an intersection between the sub-scan line SS3 and the data line D8. Similarly, a pixel P(4,6) is located at an intersection between the sub-scan line SS4 and the data line D6, a pixel P(4,7) is located at an intersection between the sub-scan line SS4 and the data line D7, and a pixel P(4,8) is located at an intersection between the sub-scan line SS4 and the data line D8.

Each of the pixels P(3,6) through P(4,8) may include a TFT or a capacitor and a display device. An example of the display device may be an OLED as described above. Light emission of the pixels P(3,6) through P(4,8) may be controlled using various methods. For example, as a scan signal is applied to the main scan line MS3 and thus the scan signal is transmitted to the sub-scan line SS3 electrically connected to the main scan line MS3, the pixels P(3,6), P(3, 7), and P(3,8) connected to the sub-scan line SS3 may be selected. In this state, when a data signal associated with brightness that is to be realized by the pixels P(3,6), P(3, 7), and P(3,8) is applied to the data lines D6 through D8, the pixels P(3,6), P(3, 7), and P(3,8) emit light with a brightness determined according to the applied data signal. Thereafter, as a scan signal is applied to the main scan line MS4 and thus the scan signal is transmitted to the sub-scan line SS4 electrically connected to the main scan line MS4, the pixels P(4,6), P(4, 7), and P(4,8) connected to the sub-scan line SS4 may be selected. In this state, when a data signal associated with brightness that is to be realized by the pixels P(4,6), P(4, 7), and P(4,8) is applied to the data lines D6 through D8, the pixels P(4,6), P(4, 7), and P(4,8) emit light with a brightness determined according to the applied data signal.

To apply a data signal to the plurality of first data lines DL1, as shown in FIG. 3, the plurality of first data line pads DLP1 may not be disposed in the display area DA of the substrate 100 but in the second area 2A. The plurality of first data line pads DLP1 may be disposed over one side (+x direction) of the plurality of first data lines DL1 to respectively correspond to the plurality of first data lines DL1. Similarly, to apply a data signal to the plurality of second data lines DL2, as shown in FIG. 3, the plurality of second data line pads DLP2 may not be disposed in the display area DA of the substrate but in the second area 2A. The plurality of second data line pads DLP2 may be disposed over one side (+x direction) of the plurality of second data lines DL2 to respectively correspond to the plurality of second data lines DL2.

For reference, the plurality of first data line pads DLP1 may be interpreted as meaning only a portion (a portion defined by a dashed circle in FIG. 3) located within the second area 2A and extending in the x-axis direction in FIG. 3. In this case, the plurality of first data line pads DLP1 and the plurality of first data lines DL1 may be connected to connection lines. The connection lines may be disposed on the same layer as the layer on which the plurality of first data line pads DLP1 and the plurality of first data lines DL1 are disposed. Alternatively, the connection lines may be disposed on a different layer than the layer on which the plurality of first data line pads DLP1 and the plurality of first data lines DL1 are disposed, but may be electrically connected to the plurality of first data line pads DLP1 and the plurality of first data lines DL1 via a contact hole or the like.

The plurality of second data line pads DLP2 may be interpreted as meaning only the portion (the portion defined by the dashed circle in FIG. 3) located within the second area 2A and extending in the x-axis direction in FIG. 3. In this case, the plurality of second data line pads DLP2 and the plurality of second data lines DL2 may be connected to connection lines. The connection lines may be disposed on the same layer as the layer on which the plurality of second data line pads DLP2 and the plurality of second data lines DL2 are disposed. Alternatively, the connection lines may be disposed on a different layer than the layer on which the plurality of second data line pads DLP2 and the plurality of second data lines DL2 are disposed, but may be electrically connected to the plurality of second data line pads DLP2 and the plurality of second data lines DL2 via a contact hole or the like.

Similarly, to apply a scan signal to the plurality of main scan lines MSL, as shown in FIG. 4, the plurality of scan line pads SLP may not be disposed in the display area DA of the substrate 100 but in the second area 2A. The plurality of scan line pads SLP may be disposed over one side (+x direction) of the plurality of main scan lines MSL to respectively correspond to the plurality of main scan lines MSL. In this case, the plurality of scan line pads SLP may be between the plurality of first data line pads DLP1 and the plurality of second data line pads DLP2.

In this case, the plurality of first data line pads DLP1 and the plurality of scan line pads SLP may be adjacent to each other, and the plurality of scan line pads SLP and the plurality of second data line pads DLP2 may be adjacent to each other. In other words, the plurality of first data line pads DLP1, the plurality of scan line pads SLP, and the plurality of second data line pads DLP2 may be sequentially arranged.

The plurality of scan line pads SLP may include a plurality of first scan line pads SLP1 and a plurality of second scan line pads SLP2. In this case, the plurality of first scan line pads SLP1 are between the plurality of first data line pads DLP1 and the plurality of second scan line pads SLP2, and the plurality of second scan line pads SLP2 are between the plurality of first scan line pads SLP1 and the plurality of second data line pads DLP2.

For reference, the plurality of scan line pads SLP may be interpreted as meaning only a portion (a portion defined by a dashed circle in FIG. 4) located within the second area 2A and extending in the x-axis direction in FIG. 4. In this case, the plurality of scan line pads SLP and the plurality of main scan lines MSL may be connected to connection lines. The connection lines may be disposed on the same layer as the layer on which the plurality of scan line pads SLP and the plurality of main scan lines MSL are disposed. Alternatively, the connection lines may be disposed on a different layer than the layer on which the plurality of scan line pads SLP and the plurality of main scan lines MSL are disposed, but may be electrically connected to the plurality of scan line pads SLP and the plurality of main scan lines MSL via a contact hole or the like.

A scan driving circuit unit SDU may be disposed between the plurality of main scan lines MSL and the plurality of scan line pads SLP. Accordingly, the plurality of main scan lines MSL and the plurality of scan line pads SLP may be electrically connected to the scan driving circuit unit SDU. The scan driving circuit unit SDU includes, for example, a shift register, and thus may include the TFT 220 formed together with the TFT 210 included in the pixels within the display area DA.

The scan driving circuit unit SDU may operate in various ways according to a display apparatus driving method. For example, scan signals may be applied from the main scan line MS1 to the main scan line MS16, and thus scan signals may be applied from the sub-scan line SS1 to the sub-scan line SS16. Accordingly, the pixels electrically connected to the sub-scan line SS1 may be selected, then the pixels electrically connected to the sub-scan line SS2 may be selected, and then the pixels electrically connected to the sub-scan line SS16 may be selected. In this case, the plurality of scan line pads SLP may be understood as portions to which a high signal, a low signal, and/or a clock signal required by TFTs included in the scan driving circuit unit SDU are applied.

The scan driving circuit unit SDU may have any of various structures. For example, as shown in FIG. 4, the scan driving circuit unit SDU may include a first scan driving circuit unit SDU1 electrically connected to the plurality of first main scan lines MSL1, and a second scan driving circuit unit SDU2 electrically connected to the plurality of second main scan lines MSL2. In this case, the plurality of first scan line pads SLP1 may be electrically connected to the first scan driving circuit unit SDU1, and the plurality of second scan line pads SLP2 may be electrically connected to the second scan driving circuit unit SDU2.

An integrated circuit or a PCB to which the integrated circuit is attached may be attached to the plurality of first data line pads DLP1, the plurality of second data line pads DLP2, and the plurality of scan line pads SLP. Accordingly, an electrical signal that has passed through the integrated circuit or the like may be input to the plurality of first data line pads DLP1, the plurality of second data line pads DLP2, and the plurality of scan line pads SLP, and thus an image over the display area DA may be realized.

In the display apparatus according to the present embodiment, the plurality of scan line pads SLP may be between the plurality of first data line pads DLP1 and the plurality of second data line pads DLP2. Accordingly, a change in the data signal transmitted to the pixels may be prevented or minimized during being transmitted to the pixels.

For example, if the plurality of first data line pads DLP1 and the plurality of second data line pads DLP2 are located between the plurality of first scan line pads SLP1 and the plurality of second scan line pads SLP2, the plurality of first scan line pads SLP1 are connected to the scan driving circuit unit SDU by crossing the plurality of first data line pads DLP1 (while the plurality of first scan line pads SLP1 and the plurality of first data line pads DLP1 are on different layers), and the plurality of second scan line pads SLP2 are connected to the scan driving circuit unit SDU by crossing the plurality of second data line pads DLP2 (while the plurality of second scan line pads SLP2 and the plurality of second data line pads DLP2 are on different layers). In this case, when a data signal for controlling the brightness of the pixels is transmitted to a plurality of data lines via the plurality of first data line pads DLP1 and the plurality of second data line pads DLP2, the data signal is changed while being transmitted to the pixels, and thus a brightness realized by a pixel may become a brightness other than an initially-intended brightness. Also, there may be parasitic capacitance in an overlapped portion between the plurality of first scan line pads SLP1 and the first data line pads DLP1 and between the plurality of second scan line pads SLP2 and the second data line pads DLP2.

In other words, a high signal, a low signal, and/or a clock signal input to the plurality of first and second scan line pads SLP1 and SLP2 and then transmitted to the scan driving circuit unit SDU via the plurality of first and second data line pads DLP1 and DLP2 affect the data signal that passes through the plurality of first data line pads DLP1 and the plurality of second data line pads DLP2. Consequently, an accurate image may not be realized over the display area DA.

However, in the display apparatus according to the present embodiment, the plurality of scan line pads SLP may be between the plurality of first data line pads DLP1 and the plurality of second data line pads DLP2. Accordingly, the high signal, the low signal, and/or the clock signal input to the plurality of scan line pads SLP do not cross the plurality of first and second data line pads DLP1 and DLP2 outside the plurality of scan line pads SLP. Alternatively, even when the high signal, the low signal, and/or the clock signal input to the plurality of scan line pads SLP cross the plurality of first and second data line pads DLP1 and DLP2, the degree of the crossing is minimized, and the high signal, the low signal, and/or the clock signal are transmitted to the scan driving circuit unit SDU. Accordingly, the data signal that passes through the plurality of first data line pads DLP1 and the plurality of second data line pads DLP2 are prevented from being affected by the high signal, the low signal, and/or the clock signal input to the plurality of scan line pads SLP, or the degree of the data signal being affected by the high signal is minimized, and thus an accurate image may be realized over the display area DA.

As shown in FIG. 4, since the scan driving circuit unit SDU is within the second area 2A, there are no circuit units on the edge of the first area 1A. Accordingly, the area of a non-display area in the first area 1A is minimized, and thus a high-quality display apparatus may be obtained.

Figure 6:
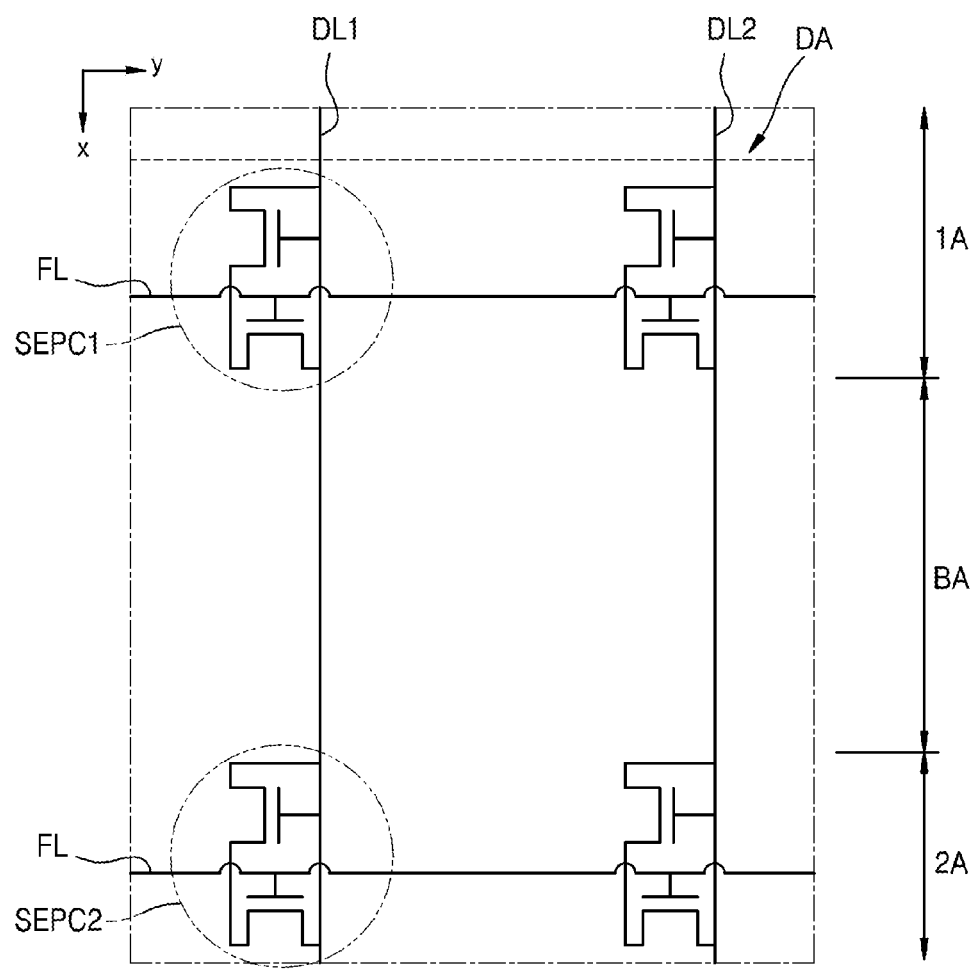
FIG. 6 is a conceptual view of a portion of the display apparatus of FIG. 1.

FIG. 6 is a schematic view of a portion of the display apparatus of FIG. 1. Referring to FIG. 6, the display apparatus according to the present embodiment includes first static electricity prevention circuits SEPC1 and second static electricity prevention circuits SEPC2. The first static electricity prevention circuits SEPC1 are between the bent area BA and display devices. In other words, the first static electricity prevention circuits SEPC1 are within the first area 1A. The second static electricity prevention circuits SEPC2 are between the plurality of first and second data line pads DLP1 and DLP2 and the bent area BA. In other words, the second static electricity prevention circuits SEPC2 are within the second area 2A. Consequently, a first static electricity prevention circuit SEPC1 and a second static electricity prevention circuit SEPC2 on a single data line DL1 are on both sides of the bent area BA, respectively. On the data lines DL1 and DL2, the first static electricity prevention circuits SEPC1 may be connected to a floating line FL, and the second static electricity prevention circuits SEPC2 may also be connected to a floating line FL.

In conventional display apparatuses in which a substrate and the like are not bent, there may be only one static electricity prevention circuit on the single data line DL1 to protect the components of the conventional display apparatuses from static electricity. However, since the display apparatus according to the present embodiment is bent at the bent area BA as described above, the bent area BA is positioned near the edge of the display apparatus even though the bent area BA is not the edge of the substrate 100. Accordingly, static electricity may be applied to the bent area BA. In this case, if there is a single static electricity prevention circuit on the single data line DL1, the components of the display apparatus are not sufficiently protected from static electricity.

For example, if the first static electricity prevention circuits SEPC1 are in the first area 1A and the second static electricity prevention circuits SEPC2 are not in the second area 2A, the first static electricity prevention circuits SEPC1 may protect the components of the display area DA from static electricity applied to the bent area BA, but a scan driving circuit unit and the like in the second area 2A may be damaged by the static electricity. On the other hand, if the second static electricity prevention circuits SEPC2 are in the second area 2A and the first static electricity prevention circuits SEPC1 are not in the first area 1A, the second static electricity prevention circuits SEPC2 may protect the scan driving circuit unit and the like from the static electricity applied to the bent area BA, but the components of the display area DA in the first area 1A may be damaged by the static electricity.

However, in the display apparatus according to the present embodiment, since the first and second static electricity prevention circuits SEPC1 and SEPC2 are on both sides of the bent area BA, even when static electricity is applied via the bent area BA, the components of the display apparatus may be effectively protected from the static electricity. Detailed structures of the first and second static electricity prevention circuits SEPC1 and SEPC2 illustrated in FIG. 6 are merely examples, and thus embodiments are not limited thereto. For example, each of the first and second static electricity prevention circuits SEPC1 and SEPC2 may have a so-called Ticks TFT structure including a single TFT and a capacitor instead of an electrostatic diode structure including two TFTs, as illustrated in FIG. 6.

Although the first and second static electricity prevention circuits SEPC1 and SEPC2 are on the data lines DL1 and DL2 in FIG. 6, embodiments are not limited thereto. In other words, static electricity prevention circuits may be on the main scan lines MS1 through MS16. In this case, first static electricity prevention circuits may be located between the bent area BA and the display devices, namely, in the first area 1A, and second static electricity prevention circuits may be located between a scan driving circuit unit and the bent area BA, namely, in the second area 2A.

Figure 7:
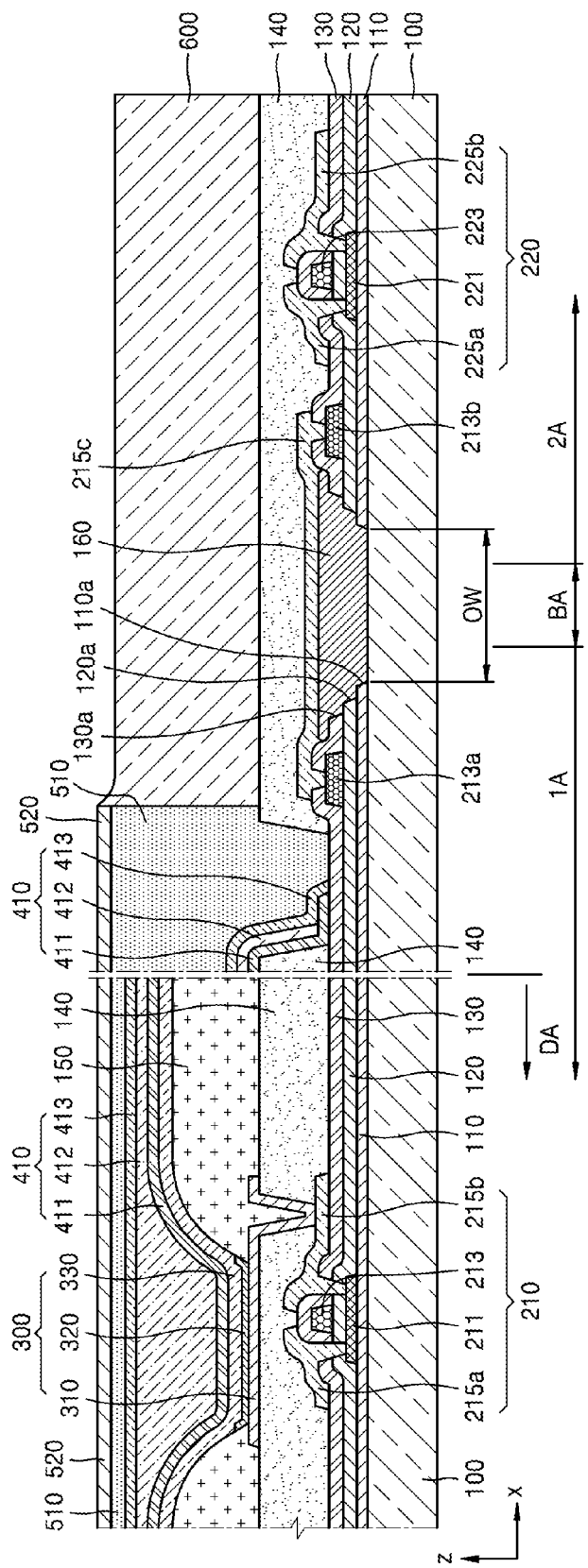
FIG. 7 is a cross-sectional view of a portion of a display apparatus according to another embodiment of the present invention.

Although the second encapsulation layer 420 for protecting the TFT 220, namely, a scan driving circuit unit, is disposed over the TFT 220 located within the second area 2A and has the same layer structure as the first encapsulation layer 410 in FIG. 2, embodiments are not limited thereto. For example, as illustrated in FIG. 7, which is a schematic cross-sectional view of a portion of a display apparatus according to another embodiment of the present invention, a bending protection layer 600 over the bent area BA may extend to over the TFT 220 located in the second area 2A, namely, a scan driving circuit unit, to thereby protect the scan driving circuit unit. In other words, a portion of the bending protection layer 600 may serve as a second encapsulation layer.

Although an end side surface (in +x direction) of the substrate 100 coincides with an end side surface (in +x direction) of the bending protection layer 600 in FIG. 7, embodiments are not limited thereto. For example, the substrate 100 may extend beyond the bending protection layer 600 in the +x direction, and a pad or the like may be disposed over a portion of the substrate 100 that is not covered with the bending protection layer 600.

Figure 8:
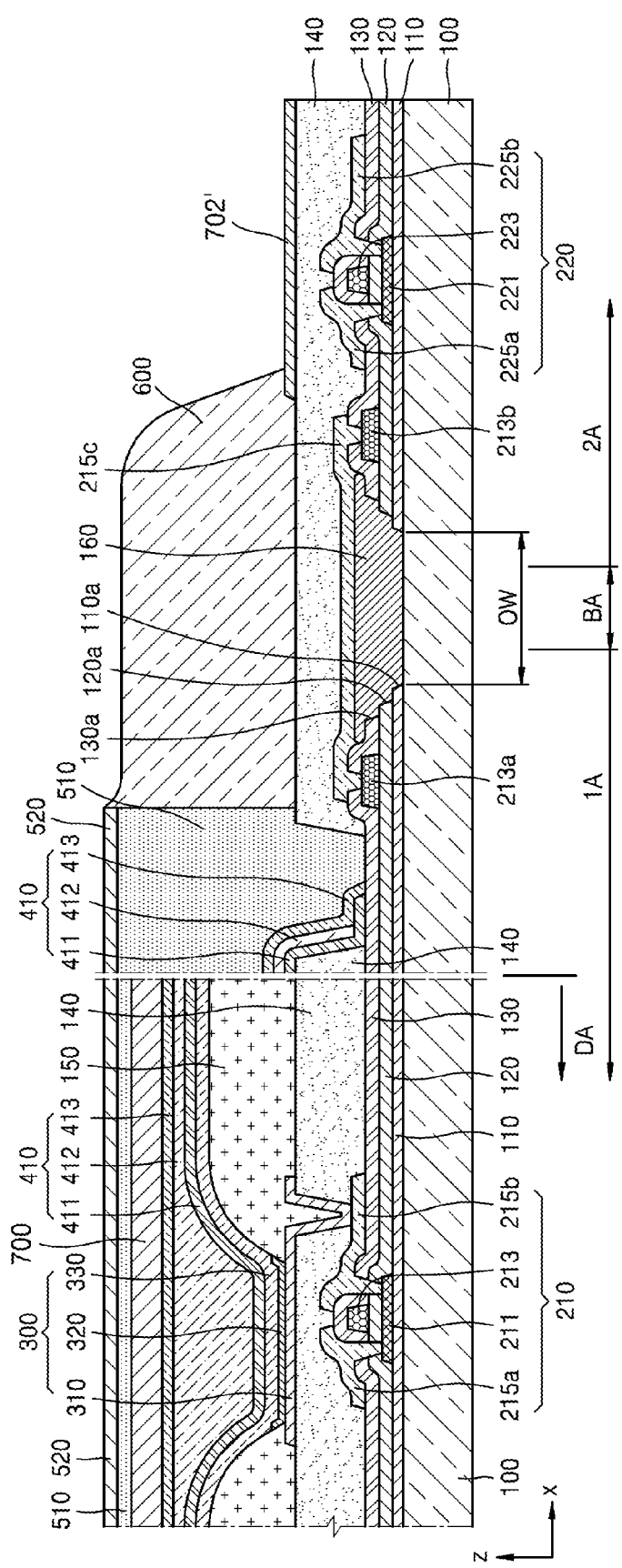
FIG. 8 is a cross-sectional view of a portion of a display apparatus according to another embodiment of the present invention.
Figure 9:
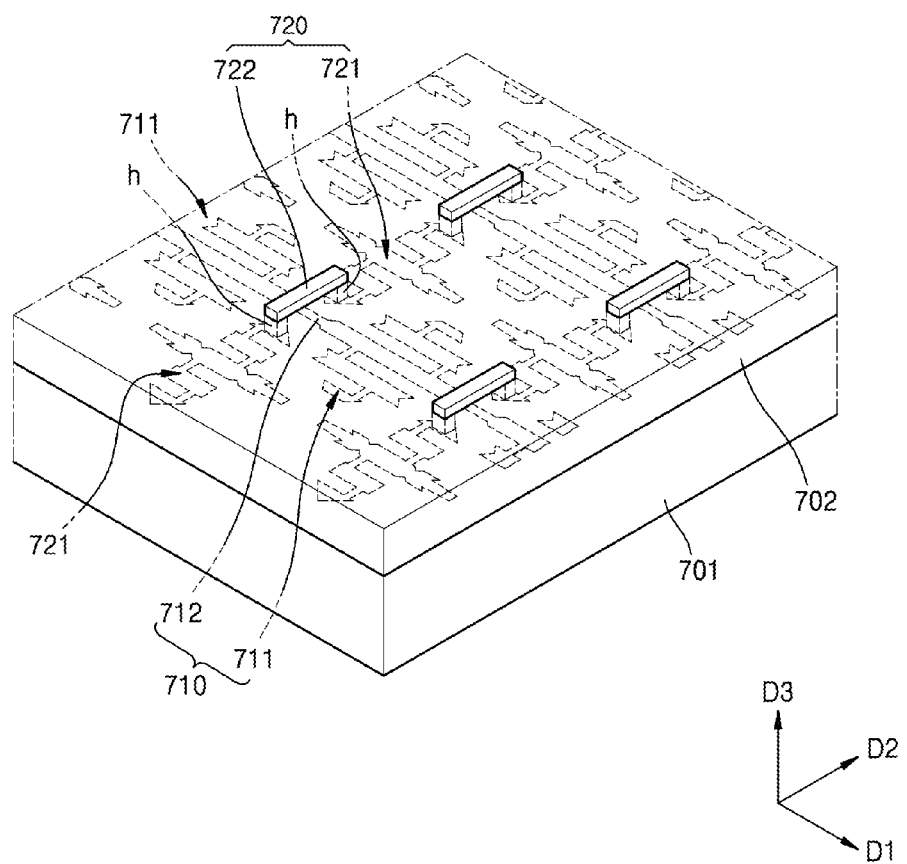
FIG. 9 is a perspective view of a portion of the display apparatus of FIG. 8.

FIG. 8 is a schematic cross-sectional view of a portion of a display apparatus according to another embodiment of the present invention. FIG. 9 is a schematic perspective view of a portion of the display apparatus of FIG. 8. The display apparatus according to the present embodiment further includes a touch screen unit 700. FIG. 9 is a perspective view of the touch screen unit 700 in FIG. 8.

Referring to FIG. 8, the touch screen unit 700 may be disposed over the first encapsulation layer 410 so as to correspond to the first area 1A. The touch screen unit 700 corresponding to the first area 1A does not mean that the area of the touch screen unit 700 is equal to that of the first area 1A, but means that the area of the touch screen unit 700 is equal to or greater than the area of at least the display area DA within the first area 1A. The touch screen unit 700 includes an insulating layer. When the insulating layer of the touch screen unit 700 is formed, a second encapsulation layer 702' may be also formed over the TFT 220 located within the second area 2A, namely, over a scan driving circuit unit to protect the scan driving circuit unit. In that case, the second encapsulation layer 702' includes the same material as the material used to form the insulating layer of the touch screen unit 700 and has the same layer structure as the layer structure of the insulating layer of the touch screen unit 700.

The touch screen unit 700 may be a capacitive touch sensor including a plurality of sensing electrodes having conductivity. In detail, the touch screen unit 700 includes a base insulating layer 701, a first sensing unit 710 and a second sensing unit 720 formed over the base insulating layer 701, and an additional insulating layer 702 covering the first sensing unit 710 and the second sensing unit 720.

The first sensing unit 710 includes a plurality of first sensing electrodes 711, and a plurality of first bridge electrodes 712 connecting the plurality of first sensing electrodes 711 to each other. As illustrated in FIG. 9, since the plurality of first sensing electrodes 711 and the plurality of first bridge electrodes 712 are integrated with each other, the first sensing unit 710 may be understood as including conductive patterns extending in a first direction D1 so as to be approximately parallel to each other.

The second sensing unit 720 also includes a plurality of second sensing electrodes 721, and a plurality of second bridge electrodes 722 connecting the plurality of second sensing electrodes 722 to each other. Accordingly, the second sensing unit 720 may be understood as including conductive patterns extending in a second direction D2 so as to be approximately parallel to each other. In order to prevent the second sensing electrodes 721 from being directly connected to the first sensing electrodes 711, the second bridge electrodes 722 pass over the first bridge electrodes 712 and thus do not contact the first bridge electrodes 712. To this end, the additional insulating layer 702 covers the first sensing electrodes 711, the first bridge electrodes 712, and the second sensing electrodes 721, and the second bridge electrodes 722 are disposed over the additional insulating layer 702 and are connected to the second sensing electrodes 721 via contact holes h formed in the additional insulating layer 702.

For reference, the first and second sensing electrodes 711 and 721 may include one material from among indium tin oxide (ITO), indium zinc oxide (IZO), indium oxide (IO), Ga-doped oxide (GZO), zinc oxide (ZnO), Al-doped oxide (AZO), fluorine doped tin oxide (FTO), antimony doped tin oxide (ATO), or In2O3, and have a single layer structure or a multi-layer structure. This is also applicable to the first bridge electrodes 712. The second bridge electrodes 722 may include metal, such as, aluminum (Al), molybdenum (Mo), silver (Ag), or aluminum (Al), and may have a single layer structure or a multi-layer structure. When each second bridge electrode 722 has a multi-layer structure, the second bridge electrode 722 may have a structure in which a layer including metal, such as Au, Mo, Ag, or Al, has an ITO layer disposed over upper and lower surfaces thereof (e.g., an ITO/Ag/ITO structure). The base insulating layer 701 and the additional insulating layer 702 may include an inorganic insulation material, such as, silicon oxide, silicon nitride, or silicon oxynitride, and may further include an organic insulation material.

The touch screen unit 700 may be formed directly on the first encapsulation layer 410. In other words, the base insulating layer 701 may be formed directly on the first encapsulation layer 410, the first sensing electrodes 711, the first bridge electrodes 712, and the second sensing electrodes 721 may be formed over the base insulating layer 701 via deposition and patterning, the additional insulating layer 702 may be formed to cover the first sensing electrodes 711, the first bridge electrodes 712, and the second sensing electrodes 721, the contact holes h may be formed in the additional insulating layer 702, and then the second bridge electrodes 722 may be formed. During this process, when the additional insulating layer 702 is formed and the contact holes h are formed, the second encapsulation layer 702' may be simultaneously formed over the scan driving circuit unit. For example, an insulating layer is formed to correspond to the entire surface of the substrate 100, and then the contact holes h are formed by patterning of the insulating layer, and at the same time the insulating layer is removed from a portion of the substrate 100 including at least the bent area BA. In this way, the additional insulating layer 702 and the second encapsulation layer 702' may be simultaneously formed apart from each other.

For reference, the touch screen unit 700 may not include the base insulating layer 701. For example, the first sensing electrodes 711, the first bridge electrodes 712, and the second sensing electrodes 721 may be formed directly on the first encapsulation layer 410 via deposition and patterning. Alternatively, the touch screen unit 700 may include the base insulating layer 701, and, in contrast with FIG. 8, the second encapsulation layer 702' may have a multi-layer structure instead of a single layer structure. For example, the second encapsulation layer 702' may have a layer corresponding to the base insulating layer 701 and a layer corresponding to the additional insulating layer 702. In this case, the layer corresponding to the base insulating layer 701 and the layer corresponding to the additional insulating layer 702 are apart from each other.

Figure 10:
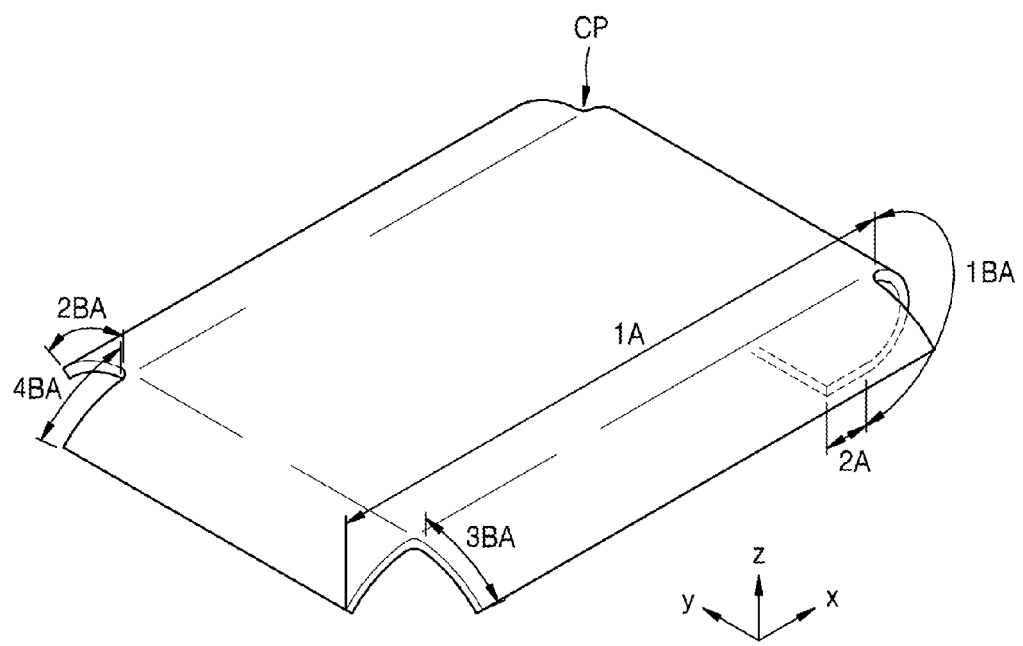
FIG. 10 is a perspective view of a portion of a display apparatus according to another embodiment of the present invention.

Although the display apparatus has only one bent area BA in FIG. 1, embodiments are not limited thereto. For example, as illustrated in FIG. 10, which is a perspective view of a portion of a display apparatus according to another embodiment of the present invention, the display apparatus may have second through fourth bent areas 2BA through 4BA in addition to a first bent area 1BA. In this case, all of the four edges of the display apparatus may be bent. To this end, there may be a chamfered portion (CP) between bent areas. The first through fourth bent areas 1BA through 4BA may each have substantially the same structure as the above-described bent area BA.

Display devices may be in the second bent area 2BA, the third bent area 3BA, and the fourth bent area 4BA included in the first area 1A. Accordingly, the display apparatus in which all of the edges are bent may be realized. In addition, by bending the display apparatus at the second through fourth bent areas 2BA through 4BA, a user may recognize that a display is not performed and a peripheral area having a pad and the like disposed thereon has a narrowed area, when a display surface of the display apparatus is viewed.

According to an embodiment of the present invention as described above, a display apparatus is able to minimize defect occurrences during manufacturing of the display apparatus while securing a long lifespan of the display apparatus. Of course, the scope of the present invention is not limited thereto.

While the inventive concept has been particularly shown and described with reference to exemplary embodiments thereof, it will be understood by those of ordinary skill in the art that various changes in form and details may be made therein without departing from the spirit and scope as defined by the following claims.

What is claimed is:

1. A display apparatus comprising:
    a substrate comprising a bent area between a first area and a second area, the substrate bent about a bending axis;
    display devices over the first area;
    a scan driving circuit unit over the second area, wherein the bent area is between the scan driving circuit unit and the first area;
    a first encapsulation layer configured to cover the display devices; and
    a second encapsulation layer apart from the first encapsulation layer and configured to cover the scan driving circuit unit
    wherein the bent area is between the first encapsulation layer and the second encapsulation layer.

2. The display apparatus of claim 1, wherein the first encapsulation layer is within the first area and the second encapsulation layer is within the second area.

3. The display apparatus of claim 1, wherein each of the first encapsulation layer and the second encapsulation layer has a multi-layer structure, and the first encapsulation layer and the second encapsulation layer have same layer structures as each other.

4. The display apparatus of claim 1, further comprising:
    a plurality of first data pads and a plurality of second data pads over the second area; and
    a plurality of data lines electrically connected to the plurality of first data pads and the plurality of second data pads and extending to the first area via the bent area.

5. The display apparatus of claim 4, further comprising:
    a first static electricity prevention circuit between the bent area and the display devices; and
    a second static electricity prevention circuit between the plurality of first and second data pads and the bent area.

6. The display apparatus of claim 4, further comprising a plurality of scan pads between the plurality of first data pads and the plurality of second data pads and electrically connected to the scan driving circuit unit.

7. The display apparatus of claim 4, further comprising a plurality of main scan lines electrically connected to the scan driving circuit unit and extending to the first area via the bent area.

8. The display apparatus of claim 7, further comprising a plurality of sub scan lines extending across the first area, arranged parallel to each other, and crossing the plurality of main scan lines in a one-to-one correspondence.

9. The display apparatus of claim 1, further comprising:
a first static electricity prevention circuit between the bent area and the display devices; and
a second static electricity prevention circuit between the scan driving circuit unit and the bent area.

10. The display apparatus of claim 1, further comprising a bending protection layer arranged on the substrate to correspond to the bent area,
wherein the bending protection layer covers the scan driving circuit unit and the second encapsulation layer is a portion of the bending protection layer.

11. The display apparatus of claim 1, further comprising a touch screen unit arranged over the substrate to correspond to the first area and comprising an additional insulating layer,
wherein the second encapsulation layer comprises a same material as a material in the additional insulating layer and has a same layer structure as the additional insulating layer.

12. The display apparatus of claim 1, wherein an entirety of the scan driving circuit unit is disposed in the second area, and the bent area and the second area each does not comprise display devices.

13. The display apparatus of claim 1, further comprising a plurality of scan pads electrically connected to the scan driving circuit unit, the plurality of scan pads locating on a same side as the scan driving circuit unit with regards to the bent area.

14. The display apparatus of claim 13, wherein the bending axis is a straight line.

\* \* \* \* \*